United States Patent
Gregory et al.

(10) Patent No.: US 11,665,865 B1
(45) Date of Patent: May 30, 2023

(54) DYNAMIC CONTROL OF TWO-PHASE THERMAL MANAGEMENT SYSTEMS FOR SERVERS

(71) Applicant: Amazon Technologies, Inc., Seattle, WA (US)

(72) Inventors: Luke Thomas Gregory, Mercer Island, WA (US); Rick Chun Kit Cheung, Lynnwood, WA (US)

(73) Assignee: Amazon Technologies, Inc., Seattle, WA (US)

( * ) Notice: Subject to any disclaimer, the term of this patent is extended or adjusted under 35 U.S.C. 154(b) by 157 days.

(21) Appl. No.: 17/109,482

(22) Filed: Dec. 2, 2020

(51) Int. Cl.
*H05K 7/20* (2006.01)
*F25B 21/04* (2006.01)

(52) U.S. Cl.
CPC ......... *H05K 7/20836* (2013.01); *F25B 21/04* (2013.01); *H05K 7/208* (2013.01); *H05K 7/20309* (2013.01); *H05K 7/20318* (2013.01); *H05K 7/20381* (2013.01)

(58) Field of Classification Search
CPC ........... H05K 7/20836; H05K 7/20309; H05K 7/20318; H05K 7/20381; H05K 7/208; F25B 21/04; F25B 2321/021; F25B 25/005; F25B 39/00; F25B 39/02; H01L 23/473; H01L 23/427; B60H 1/034; B60H 1/00885; F24F 5/0042; F24F 11/30; F28D 15/0266; F28D 15/00; G05B 15/02
See application file for complete search history.

(56) References Cited

U.S. PATENT DOCUMENTS

| | | | |
|---|---|---|---|
| 4,011,104 A * | 3/1977 | Basiulis | H01L 35/325 62/3.2 |
| 4,674,292 A * | 6/1987 | Ohya | F25B 41/35 62/223 |
| 5,611,211 A * | 3/1997 | Whipple, III | F25B 45/00 62/149 |
| 5,737,923 A | 4/1998 | Gilley et al. | |
| 8,677,772 B2 * | 3/2014 | Shih | B60H 1/00278 62/200 |
| 2003/0185538 A1 * | 10/2003 | Gurusamy | G02B 6/4201 385/135 |
| 2003/0188538 A1 * | 10/2003 | Chu | F25B 21/02 257/E23.098 |

(Continued)

FOREIGN PATENT DOCUMENTS

| | | |
|---|---|---|
| JP | 2021027045 A | 2/2021 |
| WO | 2020004219 A1 | 9/2020 |
| WO | 2020203152 A1 | 10/2020 |

OTHER PUBLICATIONS

U.S. Appl. No. 17/109,472, "Dynamic Regulation of Two-Phase Thermal Management Systems for Servers," filed Dec. 2, 2020, 31 pages.

*Primary Examiner* — Darrin D Dunn
(74) *Attorney, Agent, or Firm* — Kilpatrick Townsend & Stockton LLP

(57) ABSTRACT

A system and method for controlling a cooling system for an electronic datacenter component using a two-phase thermal management system with dynamic thermoelectric regulation. The system includes a thermoelectric cooler to transfer heat to a hot conduit of the thermal management system and initialize or maintain a natural convective flow of working fluid by maintaining a temperature difference between a hot and cold conduit.

18 Claims, 8 Drawing Sheets

(56) References Cited

U.S. PATENT DOCUMENTS

| | | | |
|---|---|---|---|
| 2005/0103472 A1* | 5/2005 | Lofland | F28F 3/12 |
| | | | 257/E23.098 |
| 2006/0187638 A1 | 8/2006 | Vinson et al. | |
| 2008/0043438 A1 | 2/2008 | Refai-ahmed | |
| 2010/0274396 A1* | 10/2010 | Yang | F25B 21/02 |
| | | | 62/239 |
| 2012/0096871 A1 | 4/2012 | Wang et al. | |
| 2012/0111028 A1* | 5/2012 | Campbell | F25B 21/02 |
| | | | 62/3.7 |
| 2012/0159978 A1* | 6/2012 | Shih | B60H 1/00278 |
| | | | 62/180 |
| 2012/0210731 A1* | 8/2012 | Campbell | F25B 21/02 |
| | | | 62/3.2 |
| 2013/0091867 A1* | 4/2013 | Campbell | H05K 7/20836 |
| | | | 29/890.035 |
| 2014/0318152 A1* | 10/2014 | Ghoshal | F25B 21/02 |
| | | | 62/3.2 |
| 2015/0075184 A1 | 3/2015 | Edwards et al. | |
| 2017/0079167 A1 | 3/2017 | Samadiani et al. | |
| 2017/0303441 A1 | 10/2017 | Farshchian et al. | |
| 2019/0211734 A1* | 7/2019 | Park | F25B 49/00 |

* cited by examiner

DYNAMIC CONTROL OF TWO-PHASE THERMAL MANAGEMENT SYSTEMS FOR SERVERS

BACKGROUND

A datacenter typically contains a collection of datacenter electronic components such as computer servers and components for the management, operation and connectivity of those datacenter electronic components. Even in isolation, these datacenter electronic components may generate sufficient heat that temperature management is important for prolonging the life of the datacenter electronic components and ensuring smooth and continuous operation of the datacenter. Typically, such datacenter electronic components are installed equipped with onboard cooling equipment, such as heat sinks and fans or even liquid cooling systems attached to components that produce the most heat, like processors.

Datacenter electronic components are often arranged together. For example, datacenter electronic components can be vertically arranged in racks or within cabinets. Datacenter cooling systems often include air cooling of individual datacenter electronic components, for example by circulating air through the casings of respective rack-mounted datacenter electronic components. Alternatively, or in combination with air cooling, heat rejection of rack-mounted datacenter electronic components can be achieved by direct liquid cooling of components of the datacenter electronic components.

BRIEF DESCRIPTION OF THE DRAWINGS

Various embodiments in accordance with the present disclosure will be described with reference to the drawings, in which.

DETAILED DESCRIPTION

Figure 1:
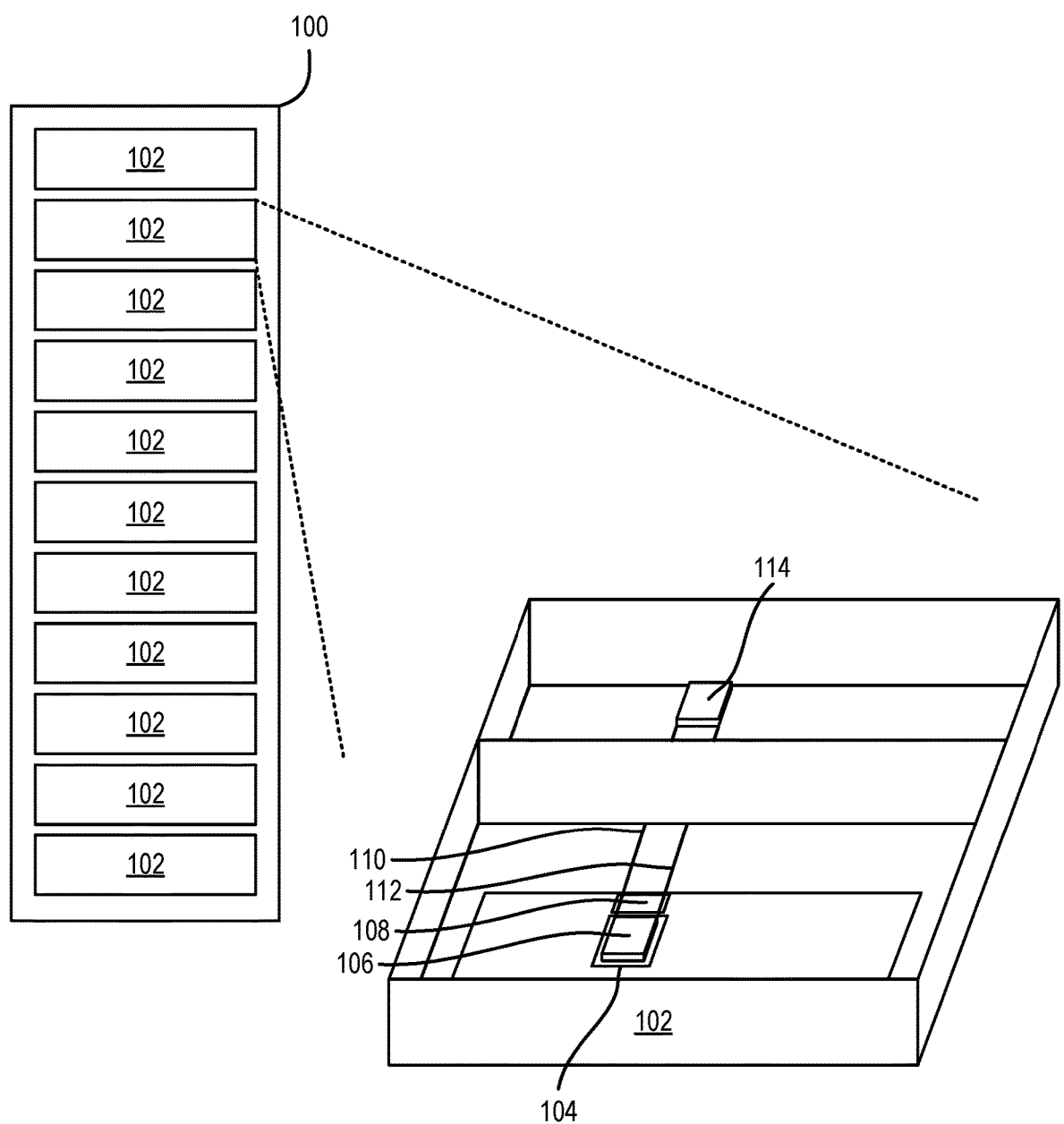
FIG. 1 illustrates an example system with a datacenter component rack and an associated datacenter component shown in an open configuration to illustrate a simplified example of a thermal management system including thermoelectric regulation, according to at least some embodiments.

Embodiments and techniques described herein are directed to thermal regulation systems and methods associated with the same for managing heat generation and buildup in electronic datacenter components. Datacenter electronic components generate and reject heat during operation and management of heat removal systems is important to properly maintain the electronic datacenter components in operation. Some thermal regulation systems are active relying on pumping of a coolant fluid and some are passive, with passive systems often relying on convection of fluid. One particular style of heat removal system is a two-phase coolant system that removes heat by absorbing heat and causing a working fluid to boil and subsequently condensing the working fluid at a condenser. A thermosiphon is one example of a heat transfer system that relies on natural convection and temperature differences to provide for flow of a working fluid between an evaporator and a condenser in a two-phase coolant system. The use of natural convection instead of pumping of the working fluid results in an efficient thermal management system that consumes little to no additional energy during steady state to maintain operation as compared to systems using pumped working fluids which introduce additional complexity, components, potential breakdown locations, and consume additional resources. The use of the thermosiphon also enables transfer and rejection of heat at a greater distance than typical systems and methods, such as natural convective cooling that is often implemented in electronic datacenter components. Due to the lack of active pumping of the working fluid, it is possible for a thermosiphon to produce a vapor bubble at the evaporator during startup of the system as the working fluid present in the evaporator begins to vaporize that may initially travel backwards through a cold line and therefore prevent use of the thermosiphon due to the lack of initial direction provided to the working fluid until the convective process begins.

Aspects of the present disclosure define a system and methods for regulating operation of a two-phase thermal management system for electronic datacenter components that is capable of overcoming the transient issues during initialization of the thermosiphon. Two-phase cooling (thermosiphons) are excellent heat removal devices for steady heat rates due to their high heat transfer efficiency from the surface of an electronic datacenter component. However, non-steady heating rates, such as during initialization and when workloads are variable, causes issues due to uneven boiling and changes in internal pressures that drive the direction of the working fluid. The present disclosure uses a thermoelectric cooling module and associated control system to dynamically control heating and cooling exchanges to ensure positive control of two-phase cooling systems in an electronic datacenter component without introducing additional moving or complex components. By eliminating the risks of startup dryout, the present disclosure enables positive vapor direction for a wider range of different applications previously unsuited for thermosiphon cooling systems including processors (CPUs, GPUs, and ASICs). As noted above, electronic devices, e.g., computer components, such as processors and memories, generate heat. A thermosiphon system can be used to remove heat from such an electronic device. Although some systems have been proposed for removing heat from computer components, the limited space available in the datacenter component rack environment introduces an additional challenge to thermosiphon system design.

In an illustrative example, a datacenter rack may include a number of datacenter components, e.g., servers, arranged together, with each datacenter component including components that reject heat during operation, such as processors and other such components. A two-phase heat management system according to the present disclosure enables heat transfer at a greater distance due to the use of a working fluid while also remaining energy efficient, thereby enabling use of the two-phase cooling system in a datacenter component to cool components that may be placed at one end of the datacenter component with the heat from such components rejected at the far end of the datacenter component.

The two-phase cooling system includes a thermoelectric cooler adjacent the evaporator of the system, the thermoelectric cooler positioned to remove heat from a cold line of the cooling system or add heat to a hot line of the cooling system, thereby biasing the flow of the working fluid from the evaporator into the hot line and preventing formation of a vapor bubble or reverse flow, where the working fluid may initially travel from the evaporator through the cold line. By applying power to the thermoelectric cooler (TEC), and dynamically monitoring the temperature difference between the hot and cold lines, a temperature difference can be maintained across the evaporator to bias flow during startup and continue flow of the working fluid in the proper direction to continue the cooling cycle in the event of variable heat rejection by the processor.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates an example system with a datacenter component rack and an associated datacenter component shown in an open configuration to illustrate a simplified example of a thermal management system including thermoelectric regulation, according to at least some embodiments. FIG. 1 illustrates a system with a datacenter component rack 100 and an associated datacenter component 102 shown in an open configuration. The system illustrates simplified components in a datacenter component rack 100 that enable techniques and methods described herein for providing dynamic regulation of a two-phase thermal management system.

The system includes a datacenter component rack 102 designed to accommodate a plurality of datacenter components 102. The datacenter component rack 100 may be designed to accept datacenter components 102 at varying locations, heights, and/or of varying sizes. In the example shown in FIG. 1, the datacenter components 102 are shown having the same size, though in some examples other and different sizes of datacenter components are envisioned. For instance, a datacenter component 102 located within the datacenter component rack 100 is of a first size, which may be sized according to a rack unit (RU) size system to be any size, such as ½ RU and/or 1 RU. Additional datacenter components 102 may be of the same size or RU as the datacenter component 102 or may be of a different size. Other datacenter components (not shown) may be installed in the datacenter component rack 100. The datacenter components 102, may be distributed at any height along the datacenter component rack 100. The datacenter components 102 may be, for example, servers, JBODs, network switches, automatic transfer switches (ATSes), power distribution units (PDUs), or any other electronic equipment that is mountable in a datacenter component rack 100, such as a server rack.

As illustrated in the datacenter component 102 shown in an open configuration, a simplified interior illustrating elements of the system described herein is shown. In particular, the datacenter component 102 includes an electronic component 104 that rejects heat during operation such as a processor, integrated circuit, power supply, storage device, or other such component. The electronic component 104 is coupled to an evaporator 106 where a working fluid may be vaporized by the heat extracted from the electronic component 104. The evaporator 106 has a hot conduit 110 and a cold conduit 112 that carry the working fluid to and away from the evaporator 106. The hot conduit 110 carries hot working fluid, sometimes a vapor, away from the evaporator 106 to a condenser 114 at the rear of the datacenter component 102. The condenser 114 condenses the working fluid, thereby ejecting heat that may be removed from the datacenter in other means, including additional working fluids, active cooling, passive cooling, and such other systems. The condenser 114 is connected to the evaporator 106 through the cold conduit 112 that carries the cold working fluid to the evaporator 106 where it may absorb heat and return to the condenser 114.

Adjacent the evaporator 106 and the hot conduit 110 and the cold conduit 112 is a thermoelectric cooler (TEC) 108. The TEC 108 may include any thermoelectric elements and devices and may produce a temperature difference between different locations on the TEC 108 in response to applying power to the TEC 108. The TEC 108 may provide heat to the hot conduit 110 and/or may remove heat from the cold conduit 112 to initially bias flow of the working fluid in the proper direction and may also be used to regulate a variable heat load generated by the electronic component 104, which may not produce heat at a steady state but may instead produce varying amounts of heat depending on a workload. As noted above, the TEC 108 may provide for dynamic regulation of a variable load of heat energy produced by the electronic component 104 and also prevents stalling working fluid or reverse flow problems during a transient phase of the cooling system. Additional details of the cooling system are provided with respect to FIGS. 2-4 below.

Figure 2:
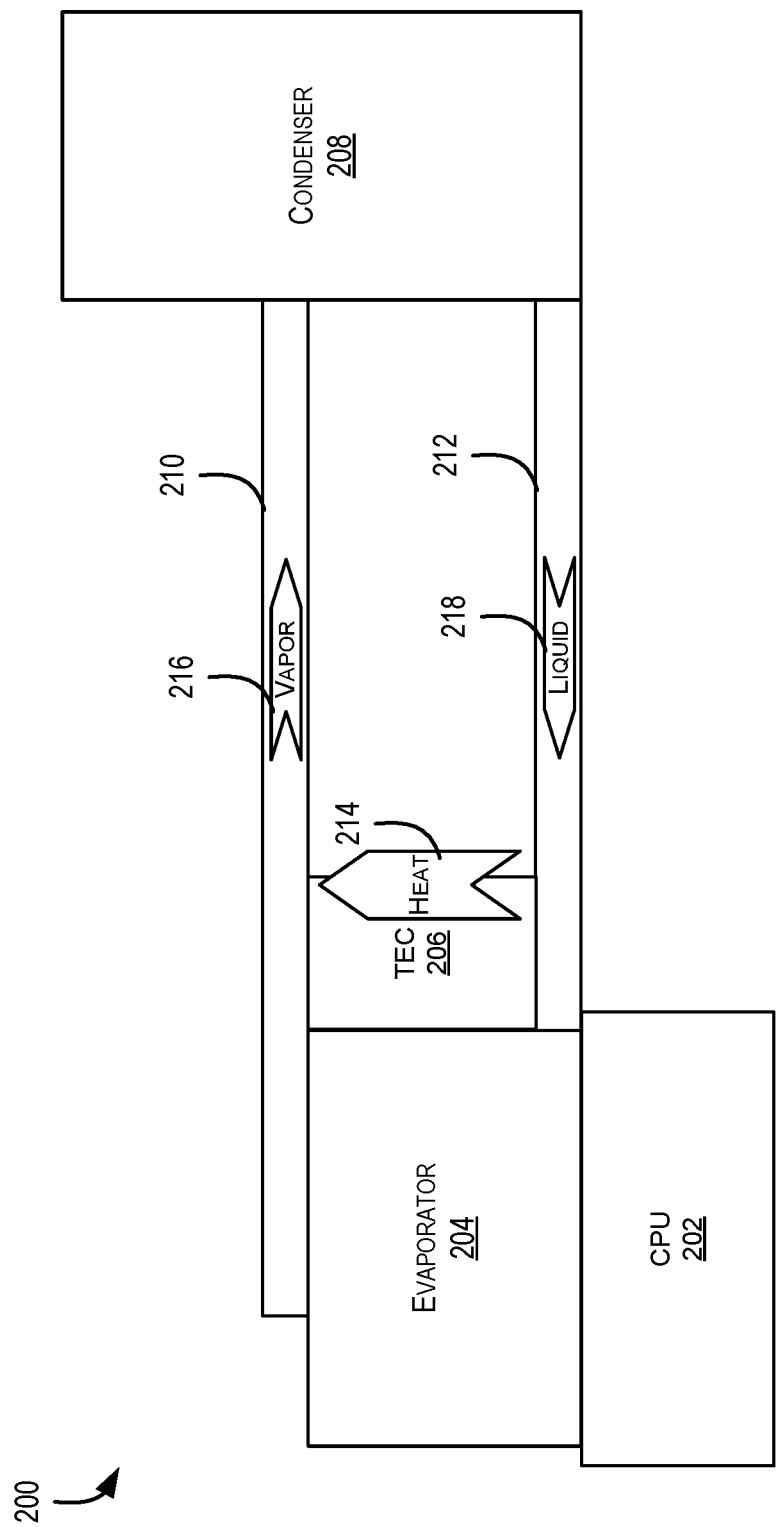
FIG. 2 illustrates a block diagram showing elements of the thermal management system with thermoelectric regulation, according to at least some embodiments.

FIG. 2 illustrates a block diagram showing elements of the thermal management system 200 with thermoelectric regulation, according to at least some embodiments. As described above with respect to FIG. 1, the thermal management system 200 serves to remove heat from a CPU 202 and expel the removed heat at a distance from the CPU 202. The CPU 202 is thermally connected to an evaporator 204, which may include any known evaporator design or materials, including aluminum, copper, and other such materials or combinations thereof to enable transfer of heat from the CPU 202 to the working fluid of the thermal management system 200. The TEC 206, as noted above, provides for regulation of the thermal management system 200 to maintain the system in operation during variable loading from the CPU 202. As noted earlier, typical two-phase thermosiphon systems are highly efficient for displacement of heat from steady state systems, but typical systems may not be capable of handling variable loads and have therefore been unsuited for cooling of datacenter components, which may be switched off for periods of time, may operate at varying capacity, and may not produce a constant amount of heat. The TEC 206 may be coupled to the hot conduit 210 and/or the cold conduit 212. In some examples, the TEC 206 may be coupled to both the hot conduit 210 and the cold conduit 212 so as to remove heat from the working fluid within the cold conduit 212 and provide heat to the working fluid within the hot conduit 210. The TEC 206 may be coupled to the hot conduit 210 and the cold conduit 212 through contact, including through a thermal conductor such as a thermal paste or may be integrally formed together in some examples. In some examples, the TEC 206 may be any device that implements the Peltier effect (the thermoelectric effect) to create a heat flux at a junction of two different materials. In some embodiments, the TEC 206 may include more than one TEC 206, for example including a first TEC 206 connected to the cold conduit 212 and a second TEC 206 connected to the hot conduit 210. Additional configurations of TECs 206 are envisioned and intended to be covered through this description including multiples of the TEC 206, arrangements at different locations such as a midpoint of the hot conduit 210 and the cold conduit 212, and other such variations are all within the spirit of the present disclosure.

During operation, the hot conduit 210 carries the working fluid as vapor 216 from the evaporator 204 to the condenser 208 and the working fluid may return as a liquid 218 from the condenser 208 to the evaporator 204. In some examples, the evaporator 204 and the condenser 208 may be positioned at a distance of over 600 millimeters from one another, for example at a distance of up to 600 to 1200 millimeters or at a distance of up to 800 to 1000 millimeters. Such distancing, which is not possible with typical passive heat removal systems, enables additional configurations for electronic datacenter components that would otherwise be impossible without compromising the performance of the electronics therein.

The hot conduit 210 is fluidly coupled to the evaporator 204 at or adjacent an upper portion of the evaporator 204. In this manner, as the working fluid vaporizes in the evaporator 204, it will naturally rise to the hot conduit 210. The cold conduit 212 is similarly coupled to or adjacent a bottom of the evaporator 204, as the cold conduit 212 contains liquid 218 that will vaporize in the evaporator 204. Additionally, the hot conduit 210 may enter the condenser at or near an upper portion of the condenser 208 with the cold conduit 212 connected at or near the bottom of the condenser 208 such that liquid 218 will naturally flow through the cold conduit 212 due to a natural convection cycle. The hot conduit 210 and the cold conduit 212 are vertically displaced from one another such that the hot conduit 210 is vertically above the cold conduit 212. The hot conduit 210 may be at a distance of three to five millimeters vertically higher than the cold conduit 212. In some embodiments, the displacement may be greater than three to five millimeters. The vertical displacement enables the vapor 216, which will naturally rise due to convection and expansion as a vapor, to preferentially travel through the hot conduit 210, especially when the hot conduit 210 is biased through the use of the TEC 206 as described herein. In some examples, the condenser 208 may be a traditional condenser unit that dissipates heat to the environment or to another system through a heat exchanger and condenses the working fluid. in some examples, the condenser 208 may include a coldplate heat exchanger and may therefore operate inside of a sealed datacenter component. The use of a coldplate or other heat exchanger that transfers heat from a first working fluid in a closed loop to a second working fluid through a coldplate enables the datacenter component to be sealed against the environment and prevent foreign material such as dust or moisture from entering into the datacenter component and potentially damaging the datacenter component or elements thereof.

During a startup or a variable load of the heat from the CPU 202, the TEC 206 may be supplied with power to transfer heat from the cold conduit 212 to the hot conduit 210 to maintain a temperature gradient and preserve the operation of the natural convection. Additionally, the initial startup vapor bubble may be biased or forced to advance through the hot conduit 210 due to the temperature gradient presented as a result of the operation of the TEC 206.

Figure 3:
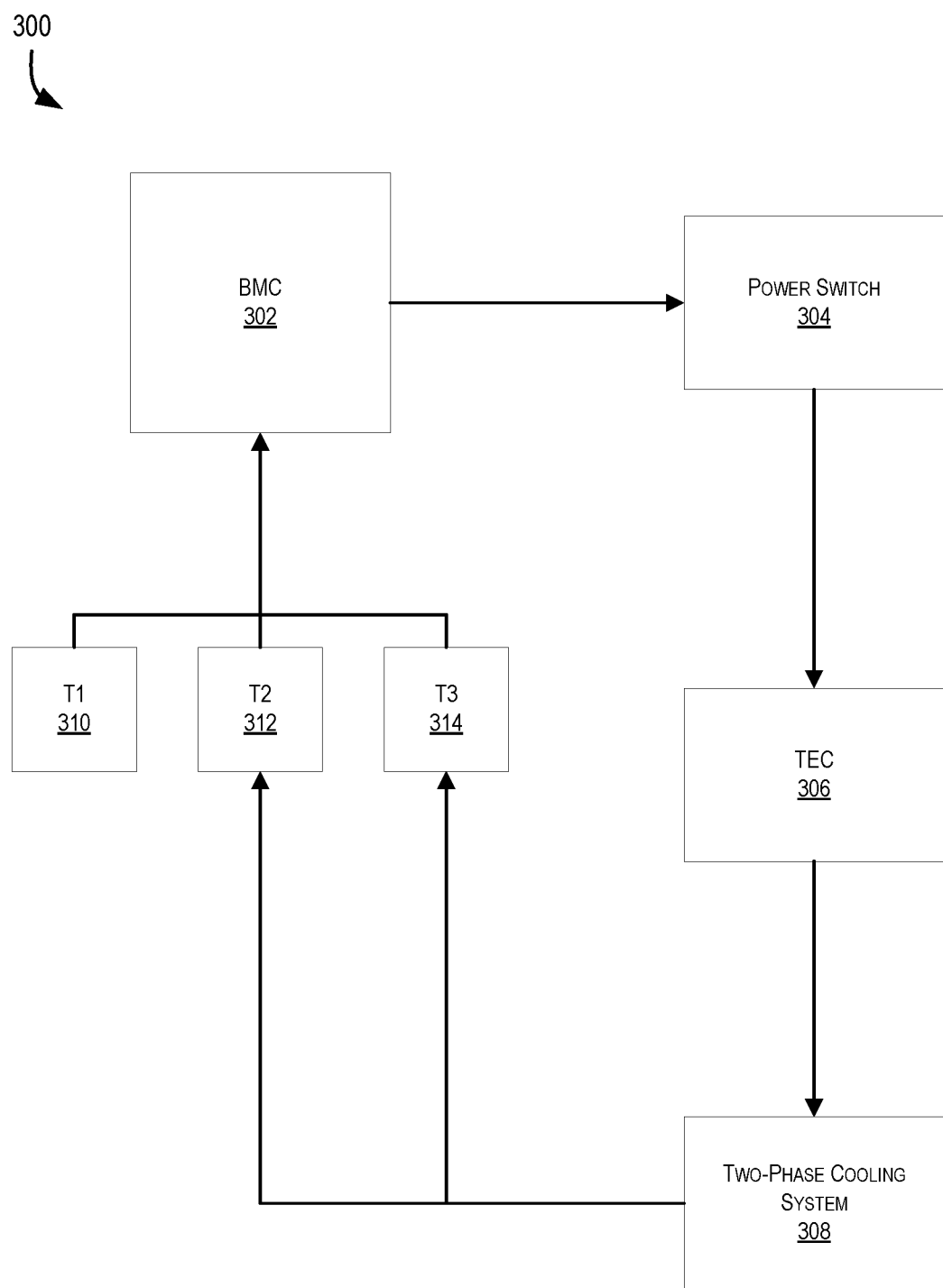
FIG. 3 illustrates a block diagram showing elements of a control system for the thermal management system with thermoelectric regulation, according to at least some embodiments.

FIG. 3 illustrates a block diagram showing elements of a control system 300 for the thermal management system with thermoelectric regulation, according to at least some embodiments. The elements of FIG. 3 illustrate basic components that may be used to control the operation of the TEC 206 of FIG. 2 to dynamically regulate operation of the two-phase thermal management system and maintain the thermosiphon that continues the cycling of the working fluid between the evaporator 204 and the condenser 208. In particular, the control system 300 includes a baseboard management controller (BMC) 302 which may be a component of the datacenter component and control operations within the datacenter component. In some examples, the BMC 302 may instead be a computing device, such as described with respect to FIG. 8 or may be application specific for management of the thermal regulation system and include components such as an ASIC for controlling the operations of control system 300. The BMC 302 may control operation of a power switch 304 that provides power from a power supply to the TEC 306, which may be the same as the TEC 206. The TEC 306, upon receiving power from the power switch 304, provides heat transfer to and/or away from the two-phase cooling system 308, which may be the thermal management system 200 of FIG. 2. The TEC 306 may transfer heat to a hot conduit, to an upper end of an evaporator, to an upper end of a condenser, or anywhere along a hot portion of the two-phase cooling system 308. The TEC 306 may also remove heat in a similar manner from any portion of the cold portion of the two-phase cooling system 308 including the cold conduit, the bottom of the evaporator, or the bottom of the condenser.

The BMC 302 may control the power switch 304 based on an open loop control system or a closed loop control system using inputs from temperature sensors 310, 312, and 314. The temperature sensor 310 may include an ambient temperature sensor. The temperature sensors 312 and 314 may provide temperature data from the electronic component being cooled and temperature at the evaporator. In some examples, the temperature sensors 312 and 314 may provide temperatures at an inlet and an outlet of the evaporator. In some examples, the temperature sensor 310 may provide a temperature of the electronic component. The BMC 302 receives temperature data from the temperature sensors 310, 312, 314, and determines when to apply power to the TEC 306 through the power switch 304. The temperature data may, for example, indicate that the temperature of the evaporator, the electronic component, and/or the ambient temperature exceed a predetermined threshold temperature. In some examples, the temperature data may, for example indicate a difference in pressure between the cold conduit and the hot conduit or across the evaporator. Such temperature data may be useful for determining when to apply power to the TEC 306, for example to increase a temperature difference across the evaporator or between the hot and cold conduits, to bias the flow of the working fluid and preferentially begin flow in the proper direction.

In some examples, the BMC 302 may receive other signals, such as startup signals for electronic components indicating when an electronic component is started up or begins processing. In some examples the BMC 302 may receive workload data indicating a present workload or upcoming workload for different electronic components and may begin to transfer heat via the TEC 306 to begin the convective movement of the working fluid associated with those electrical components to begin the cooling process before a threshold temperature is reached. The BMC 302 may control when the TEC 306 is disabled via the power switch 304. The BMC may, for example identify that the two-phase cooling system is operating at steady state and therefore the TEC 306 is no longer needed to maintain the flow of the working fluid. The BMC 302 may, for example identify that a temperature difference across the evaporator or between the hot and cold conduits is steady or within a predetermined percentage for a predetermined time period, indicating the system is operating at steady state. In some examples, the regulation provided by the BMC 302 is iterative, with instructions to power or cut off power to the TEC 306 provided at regular intervals, such as once per second or every few seconds.

Figure 4:
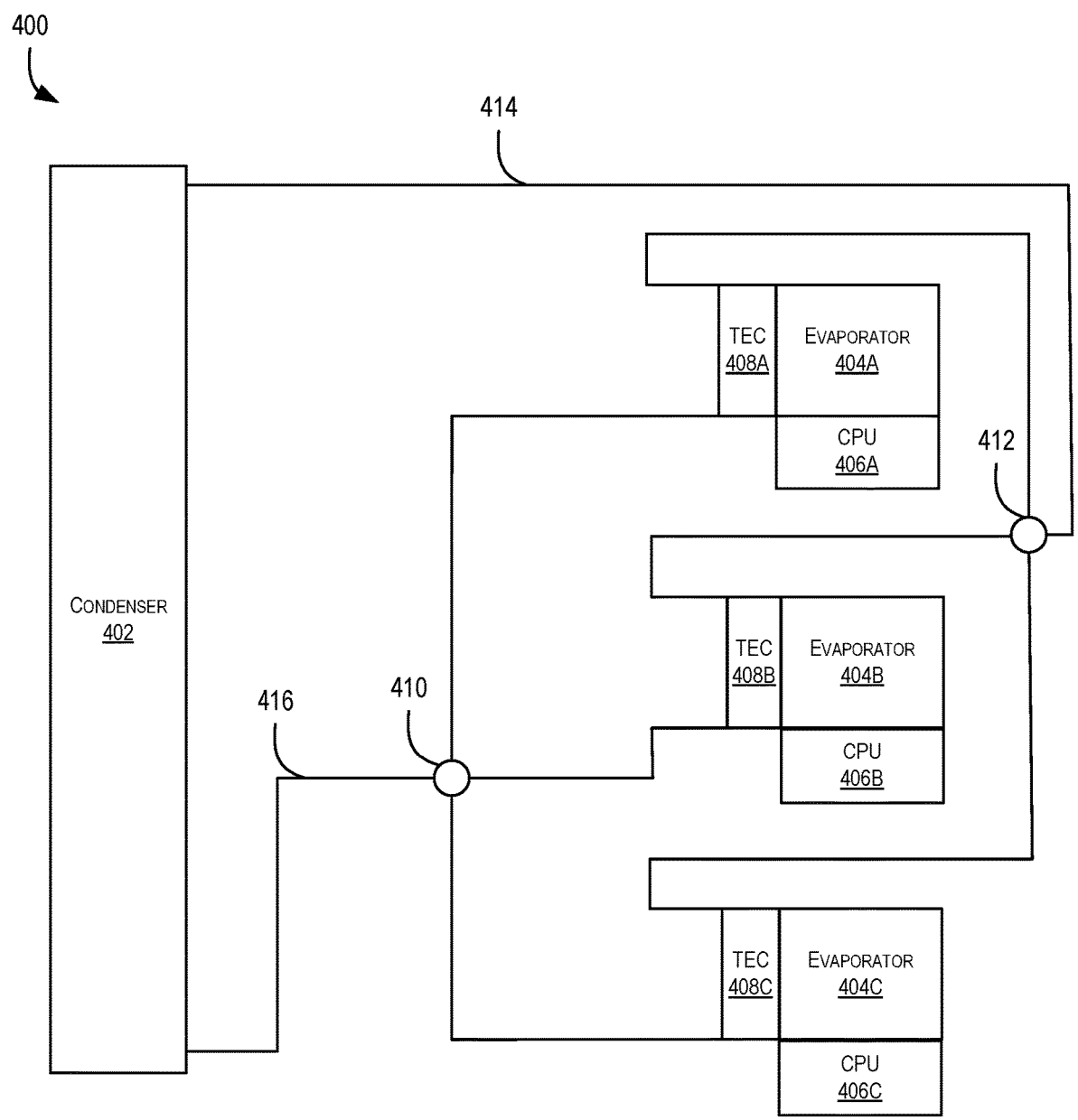
FIG. 4 illustrates a block diagram showing elements of a multi-zone thermal regulation system with thermoelectric regulation, according to at least some embodiments.

FIG. 4 illustrates a block diagram showing elements of a multi-zone thermal regulation system 400 with thermoelectric regulation, according to at least some embodiments. The multi-zone thermal regulation system 400 may operate in a similar manner to the thermal regulation system described above with respect to FIGS. 1-3. The multi-zone thermal regulation system 400 may provide a single condenser 402 with several evaporators 404 to thermally regulate multiple CPUs 406 with a single system rather than with individual systems for each. The multi-zone thermal regulation system 400 may provide uniform or non-uniform cooling to the various CPUs 406 and may provide such cooling without the use of controlled valves, thereby providing for a branched cooling system capable of meeting different cooling needs on different branches without the addition of complex components such as switching valves that may fail or provide complication to the system.

In particular, the multi-zone thermal regulation system 400 relies on the same principles described above but uses a cold conduit coupled, in parallel, to multiple different evaporators as well as a hot conduit connected, in parallel, to each of the different evaporators to provide a single system capable of on-demand temperature regulation. The multi-zone thermal regulation system 400 includes the condenser 402, evaporators 404, TECs 408, CPUs 406 (which may be any electronic or heat rejecting component), hot conduit 414, cold conduit 416, and joints 410 and 412. The hot conduit 414 receives working fluid from each evaporator 404 and returns the hot working fluid to the condenser 402, similarly, the cold conduit 416 delivers cold working fluid to each evaporator 404. Joints 410 and 412 provide for the conduits to branch into the three parallel branches as illustrated, though other numbers and configurations of branches for the conduits are envisioned that will operate according to the present disclosure.

In operation, CPU 406A, CPU 406B, and CPU 406C may each have different workloads and different heat transfer needs based on the different workloads and different types of electrical components that may be placed in place of the CPUs 406. The multi-zone thermal regulation system 400 does not require valves to meter working fluid to each of the evaporators but will naturally meter based on the heat transferred through each evaporator due to natural convection. For example if CPU 406B is producing significantly more heat than the other CPUs 406A and 406C, then evaporator 404B will cause more working fluid to vaporize and return through the hot conduit 414. The convective movement of the working fluid traveling at a greater rate through the evaporator with the greater heat flux, evaporator 404B, will result in greater working fluid flowing through the cold conduit flowing to evaporator 404B than to the other evaporators 404A and 404C.

In a similar manner, the regulation of the TECs 408 may be individual to each component and provide for individual regulation of cooling for each evaporator 404. For example during a variable phase of operation, any of CPUs 406 may experience downtime or reduced workloads compared to other CPUs 406 and therefore associated evaporators 404 may reduce in temperature and may cease convective flow. The TECs 408 may be used to transfer heat and maintain a temperature difference to preserve the convective flow through each branch and ensure no portion of the multi-zone thermal regulation system 400 becomes stagnant or experiences backflow that may impact other elements of the system.

Figure 5:
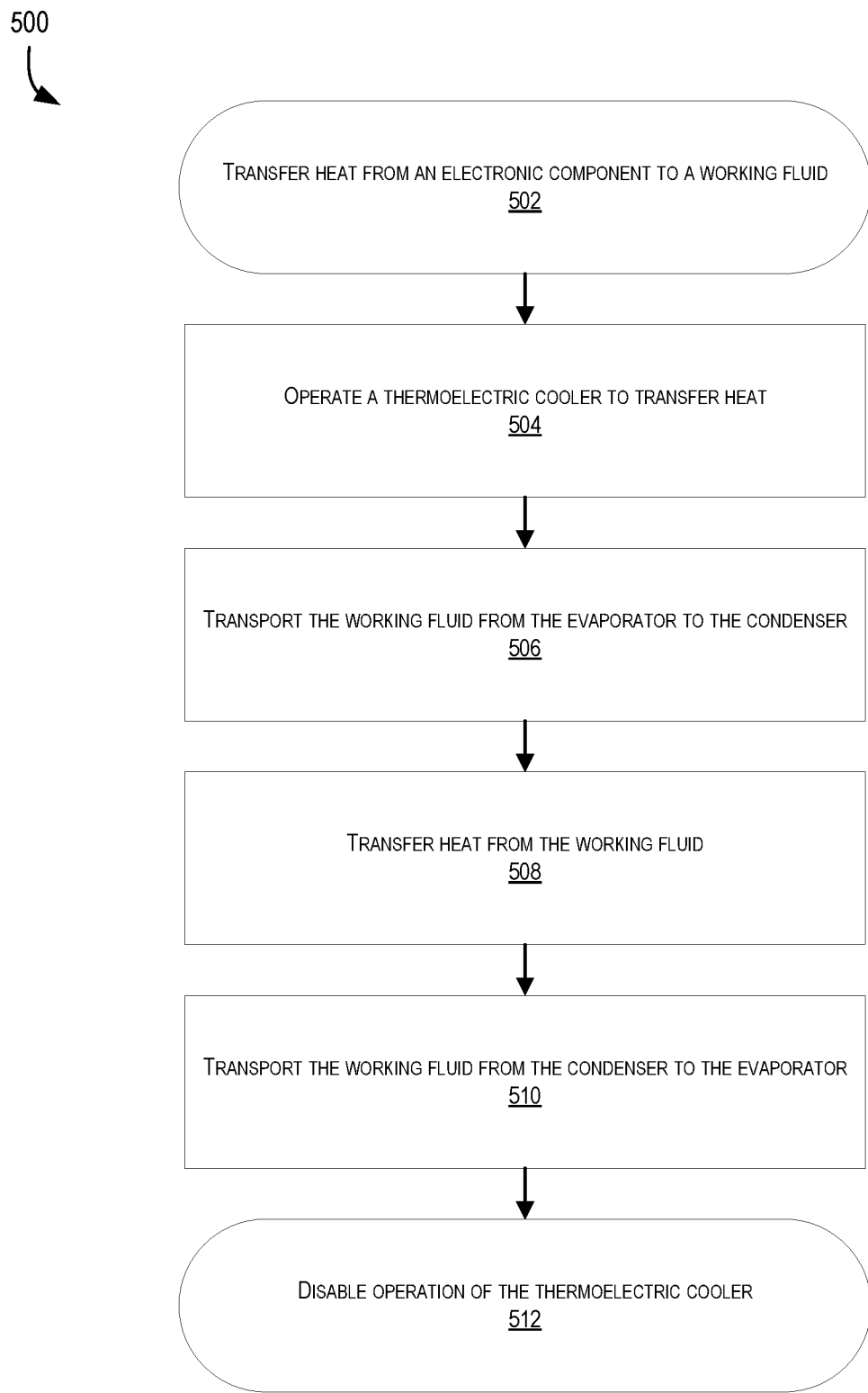
FIG. 5 illustrates an example process for thermally regulating elements of a datacenter component, according to at least some embodiments.

FIG. 5 illustrates an example process 500 for thermally regulating elements of a datacenter component, according to at least some embodiments; Some or all of the process 500 (or any other processes described herein, including processes 600 and 700, or variations, and/or combinations thereof) may be performed under the control of one or more computer systems, such as the BMC or a remote computing system, configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The process 500 may be implemented using any of the systems described herein including systems 200, 300, and 400.

At 502, process 500 includes transferring heat from an electronic component to a working fluid. The transfer of heat from the electronic component to the working fluid may take place in an evaporator, such as evaporator 204 of FIG. 2. The heat may be transferred through the evaporator being in contact with the electrical component and the working fluid traveling through the evaporator.

At 504, the process includes operating a TEC to transfer heat. The TEC may be a TEC 206 or any other TEC described herein and may transfer heat from a cold conduit of a thermal regulation system to a hot conduit of a thermal regulation system. In some examples, the TEC may transfer heat away from a cold conduit and a TEC may also separately transfer heat to a hot conduit to generate or maintain a temperature difference between a hot conduit and a cold conduit.

At 506, the process 500 includes transporting the working fluid from the evaporator of the thermal regulation system to the condenser of the thermal regulation system. The working fluid may be transported with aa forced system, such as with a pump or other driving feature or may be driven due to natural convection within the thermal regulation system along the hot conduit as described above.

At 508, the process 500 includes transferring heat from the working fluid. The heat may be transferred from the working fluid at the condenser, which may include any typical condenser unit, a coldplate, a heat exchanger, active and passive cooling systems, and other such heat dissipation and removal systems. This may include condensing the working fluid from a vapor to a fluid at the condenser.

At 510, the process 500 includes transporting the working fluid from the condenser to the evaporator. As with the transport of the working fluid to the evaporator, the working fluid may be forced with a pump or other such device or may be allowed to flow due to natural convection within the thermal regulation system and due to the thermosiphon system of the two-phase thermal regulation system.

At 512, the process 500 includes disabling operation of the thermoelectric cooler. The TEC may be disabled based on the system operating at a steady state, due to sufficient temperature difference existing between the hot and cold conduits, or may be partially disabled or reduced. In some examples, the operation of the TEC may be reduced when only alight additional heat transfer is needed to maintain the system in a steady state, effectively providing similar heat flows through the working fluids as though the system were operating in steady state, even when operation or demand for heat removal is variable.

Figure 6:
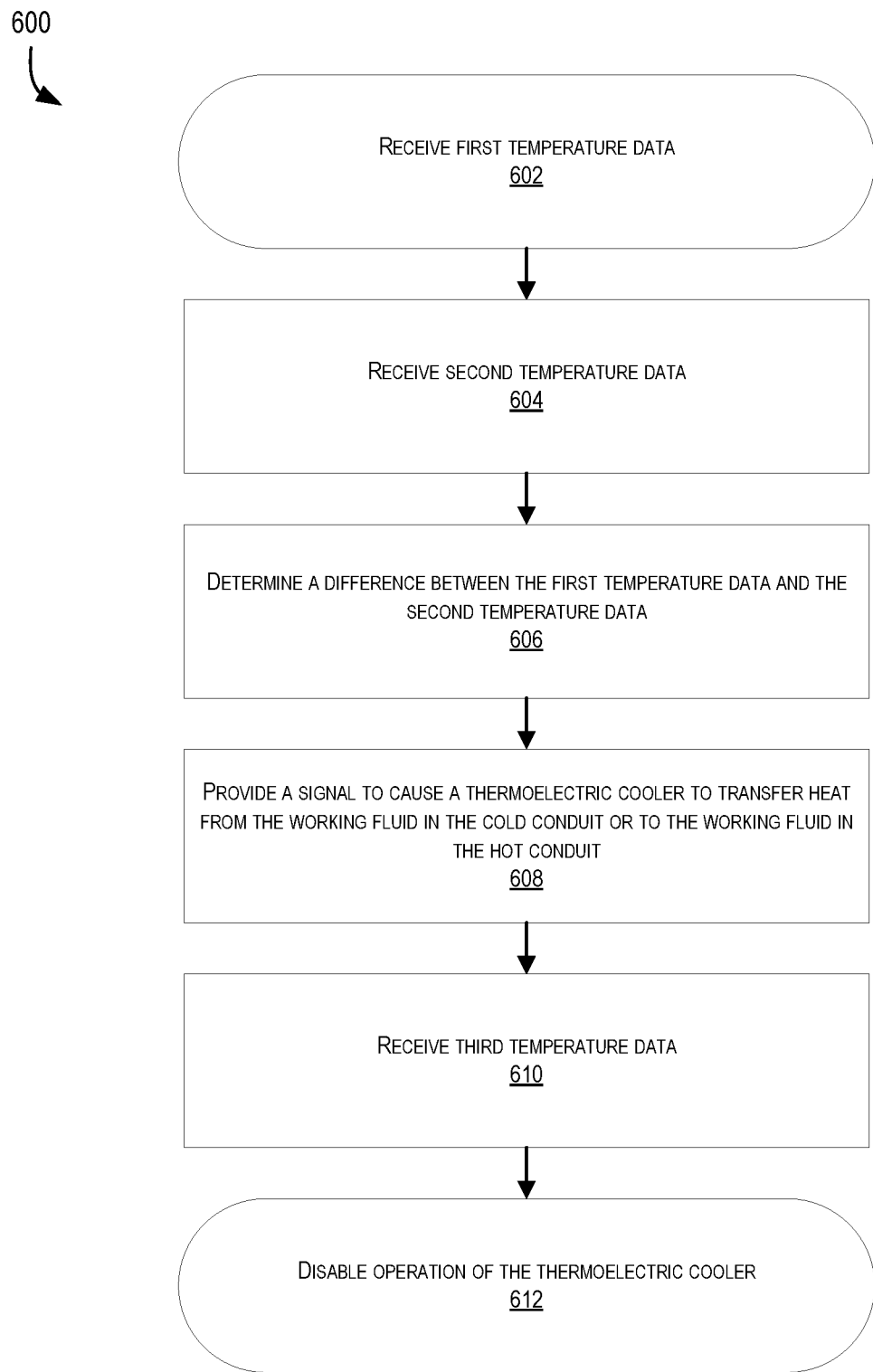
FIG. 6 illustrates an example process for initializing a thermal regulation system with a thermoelectric cooler, according to at least some embodiments.

FIG. 6 illustrates an example process 600 for initializing a thermal regulation system with a thermoelectric cooler, according to at least some embodiments. The process 600 may be performed using any of the systems described herein, and may be implemented, at least in part on a computing device, such as BMC 302.

At 602, the process 600 includes receiving first temperature data. The first temperature data may be ambient temperature data within the electronic datacenter component, may be temperature data indicating a temperature of the hot conduit or the cold conduit and may be a temperature of the electronic component. The first temperature data may be received at the BMC or other computing device.

At 604, the process 600 includes receiving second temperature data. The second temperature data may be from a different location of the system than the first temperature data and may include a number of potential sources. The second temperature data may be ambient temperature data within the electronic datacenter component, may be temperature data indicating a temperature of the hot conduit or the cold conduit and may be a temperature of the electronic component. The second temperature data may be received at the BMC or other computing device.

At 606, the process 600 includes determining a difference between the first temperature data and the second temperature data. The difference may indicate a difference across the evaporator, between the hot and cold conduits, between ambient temperature and the temperature of the electronic component, or other such temperatures.

At 608, the process 600 includes providing a signal to cause a TEC to transfer heat from the working fluid in the cold conduit or to the working fluid in the hot conduit. In response to determining that the temperature difference exceeds a predetermined threshold, for example when the difference between ambient and the electronic component is too large or when the difference is below a threshold, for example when a difference across the evaporator or between the hot and cold conduits is insufficient to provide for convective flow or the working fluid, the TEC may begin to transfer heat as controlled by the BMC.

At 610, the process 600 includes receiving third temperature data. The third temperature data may be the temperature of the electronic component or the ambient temperature and may indicate that the system is operating at a steady state or other such condition.

At 612, the process 600 includes disabling operation of the TEC. The TEC may be disabled based on the system operating at a steady state, due to sufficient temperature difference existing between the hot and cold conduits, or may be partially disabled or reduced. In some examples, the operation of the TEC may be reduced when only alight additional heat transfer is needed to maintain the system in a steady state, effectively providing similar heat flows through the working fluids as though the system were operating in steady state, even when operation or demand for heat removal is variable. In some examples, the operation may be disabled based on the third temperature data indicating that the electronic component is cooling or is at a steady state and additional input from the TEC is no longer needed.

Figure 7:
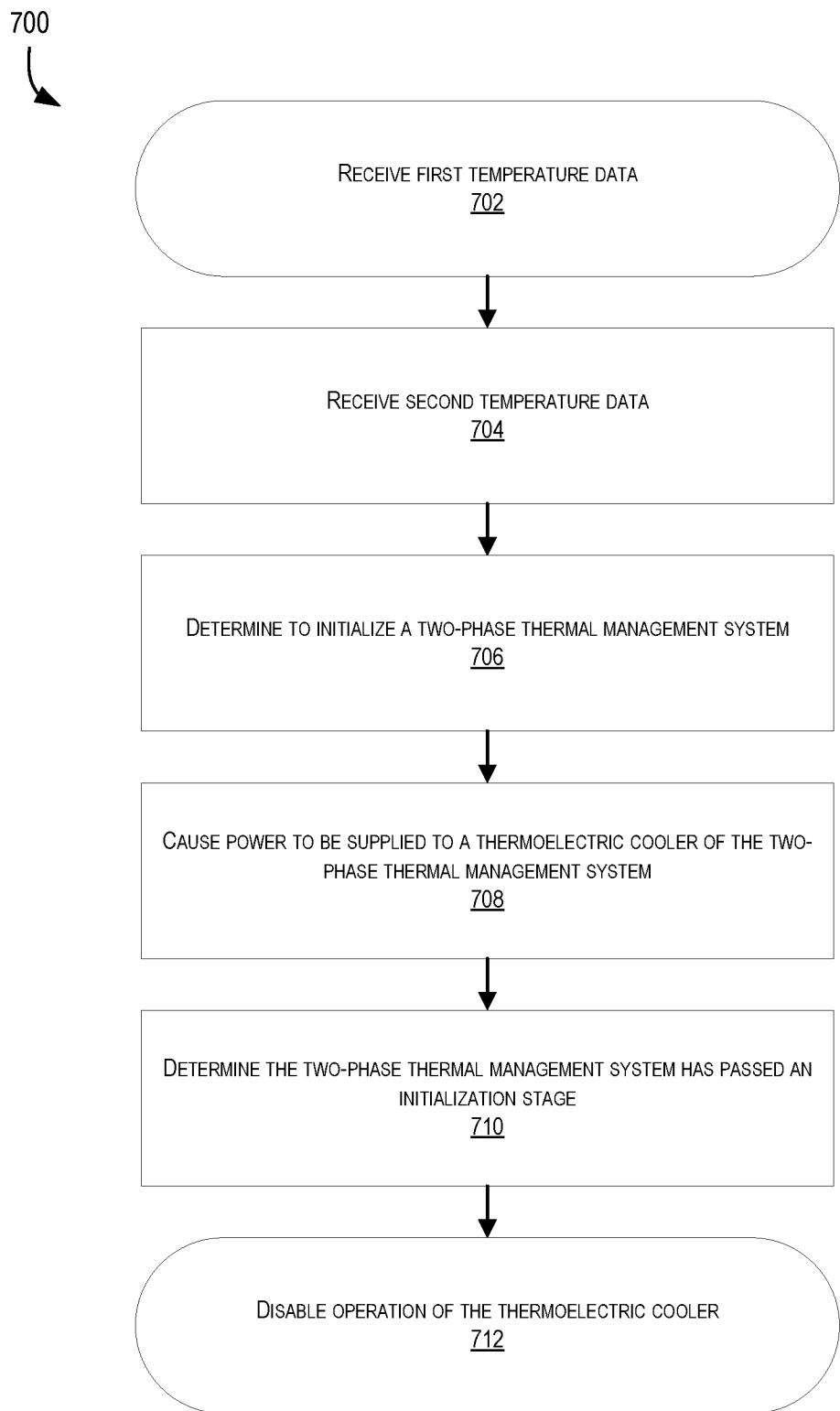
FIG. 7 illustrates an example process for initializing a thermosiphon system using a thermoelectric cooler, according to at least some embodiments.

FIG. 7 illustrates an example process 700 for initializing a thermosiphon system using a thermoelectric cooler, according to at least some embodiments. The process 700 may be performed using any of the systems described herein, and may be implemented, at least in part on a computing device, such as BMC 302.

At 702, the process 700 includes receiving first temperature data. The first temperature data may be ambient temperature data within the electronic datacenter component, may be temperature data indicating a temperature of the hot conduit or the cold conduit and may be a temperature of the electronic component. The first temperature data may be received at the BMC or other computing device.

At 704, the process 700 includes receiving second temperature data. The second temperature data may be from a different location of the system than the first temperature data and may include a number of potential sources. The second temperature data may be ambient temperature data within the electronic datacenter component, may be temperature data indicating a temperature of the hot conduit or the cold conduit and may be a temperature of the electronic component. The second temperature data may be received at the BMC or other computing device.

At 706, the process 700 includes determining to initialize a two-phase thermal management system. The determination may be based on a startup signal for an electronic component, for example indicating that the electronic component is beginning operation or is beginning a large workload, or is substantially increasing workload such that cooling resources may be required. The determination may also be based on the first and second temperature data, for example by identifying that the electronic component has exceeded a predetermine threshold temperature or that a temperature difference between a hot and cold conduit is less than a threshold amount and the electronic component is beginning operation or has started up as previously indicated.

At 708, the process 700 includes causing power to be supplied to a TEC of the two-phase thermal management system. The TEC may be a TEC 206 or any other TEC described herein and may transfer heat from a cold conduit of a thermal regulation system to a hot conduit of a thermal regulation system. In some examples, the TEC may transfer heat away from a cold conduit and a TEC may also separately transfer heat to a hot conduit to generate or maintain a temperature difference between a hot conduit and a cold conduit.

At 710, the process 700 includes determining the two-phase thermal management system has passed an initialization stage. After an initial startup phase, for example if the system is operating at a steady state with non-variable heat removal requirements, the BMC may determine that the startup phase is passed and therefore may proceed to 712.

At 712, the process 700 includes disabling operation of the TEC in response to passing the initialization phase. The TEC may be disabled based on the system operating at a steady state, due to sufficient temperature difference existing between the hot and cold conduits, or may be partially disabled or reduced. In some examples, the operation of the TEC may be reduced when only alight additional heat transfer is needed to maintain the system in a steady state, effectively providing similar heat flows through the working fluids as though the system were operating in steady state, even when operation or demand for heat removal is variable. In some examples, the operation may be disabled based on the third temperature data indicating that the electronic component is cooling or is at a steady state and additional input from the TEC is no longer needed.

Figure 8:
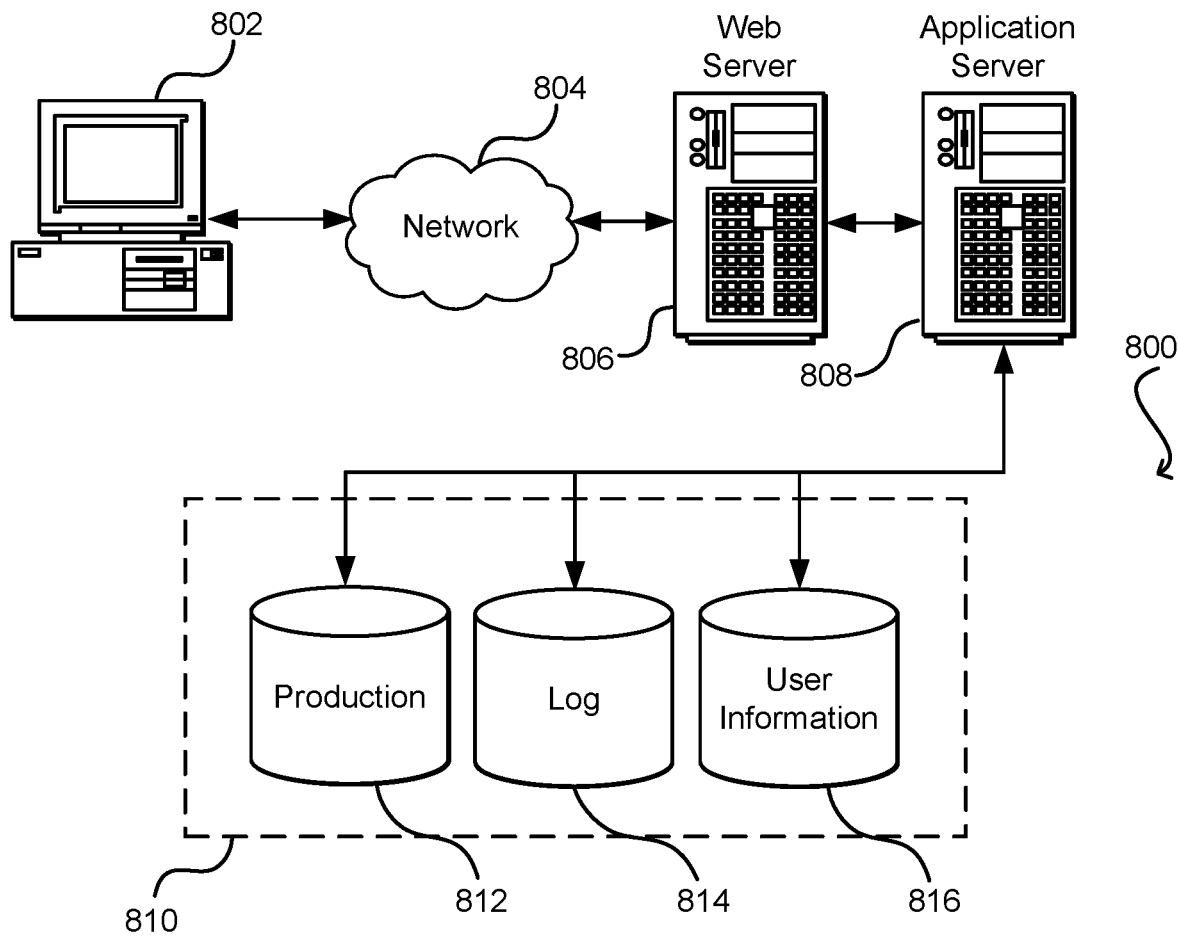
FIG. 8 illustrates an environment in which various embodiments can be implemented.

FIG. 8 illustrates aspects of an example environment 800 for implementing aspects in accordance with various embodiments. As will be appreciated, although a Web-based environment is used for purposes of explanation, different environments may be used, as appropriate, to implement various embodiments. The environment includes an electronic client device 802, which can include any appropriate device operable to send and receive requests, messages, or information over an appropriate network 804 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of controlling a thermosiphon used to cool an electronic component, the method comprising:
   receiving, by a baseboard management controller (BMC), electronic component temperature data indicative of a temperature of the electronic component, wherein the electronic component is thermally coupled to an evaporator of the thermosiphon, and wherein a working fluid of the thermosiphon is conveyed via convection;
   receiving, by the BMC, evaporator temperature data indicative of at least one of an inlet temperature of the working fluid at an inlet side of the evaporator or an outlet temperature of the working fluid at an outlet side of the evaporator;
   in response to the evaporator temperature data being indicative of a temperature difference between the working fluid at the inlet side of the evaporator and the working fluid at the outlet side of the evaporator being less than a predetermined threshold, causing, by the BMC, a thermoelectric cooler to transfer heat from the working fluid at the inlet side of the evaporator to the working fluid at the outlet side of the evaporator;
   determining, by the BMC, that a flow of the working fluid in the thermosiphon has reached a steady state based on the evaporator temperature data; and
   altering, by the BMC, operation of the thermoelectric cooler in response to determining that the flow of the working fluid in the thermosiphon has reached the steady state.

2. The method of claim 1, wherein causing the thermoelectric cooler to transfer heat is further based on receiving an indication that the electronic component is operational.

3. The method of claim 1, wherein the thermoelectric cooler is configured to remove heat from an inlet of the evaporator.

4. The method of claim 1, wherein the thermoelectric cooler is configured to apply heat to an outlet of the evaporator.

5. A method of controlling a thermosiphon to cool an electronic component, the method comprising:

receiving, by a baseboard management controller (BMC), component temperature data indicative of a temperature of an electronic component;

determining, by the BMC, that the temperature of the electronic component exceeds a predetermined threshold;

in response to determining that the temperature of the electronic component exceeds the predetermined threshold, causing, via the BMC, a thermoelectric cooler to transfer heat from a working fluid of the thermosiphon at an inlet side of an evaporator of the thermosiphon to the working fluid at an outlet side of the evaporator, wherein the evaporator is thermally coupled with the electronic component, and wherein the working fluid is conveyed via convection;

determining, by the BMC, that a flow of the working fluid in the thermosiphon has reached a steady state based on working fluid temperature data indicative of one or more temperatures of the working fluid; and altering, by the BMC, operation of the thermoelectric cooler in response to determining that the flow of the working fluid in the thermosiphon has reached the steady state.

6. The method of claim 5, further comprising:
ceasing operation of the thermoelectric cooler in response to the working fluid temperature data being indicative of a temperature difference between the working fluid at the outlet side of the evaporator and the working fluid at the inlet side of the evaporator exceeding a predetermined threshold.

7. The method of claim 5, further comprising:
ceasing operation of the thermoelectric cooler in response to the working fluid temperature data being indicative of a change in a temperature difference between the working fluid at the outlet side of the evaporator and the working fluid at the inlet side of the evaporator remaining below a predetermined threshold over a time period.

8. The method of claim 7, further comprising causing the thermoelectric cooler to transfer heat from the working fluid at the inlet side of the evaporator to the working fluid at the outlet side of the evaporator in response to the working fluid temperature data being indicative of a temperature difference between the working fluid on the outlet side of the evaporator and the working fluid at the inlet side of the evaporator being below a predetermined threshold.

9. The method of claim 5, further comprising:
receiving, by the BMC, second component temperature data indicative of a temperature of a second electronic component;

determining, by the BMC, that the temperature of the second electronic component exceeds a second predetermined threshold; and in response to determining that the temperature of the second electronic component exceeds the second predetermined threshold, causing, via the BMC, a second thermoelectric cooler of the thermosiphon to transfer heat from the working fluid at an inlet side of a second evaporator to the working fluid at an outlet side of the second evaporator, wherein the second evaporator is thermally coupled with the second electronic component, and wherein the second evaporator is connected in parallel with the evaporator in the thermosiphon.

10. The method of claim 9, wherein causing the thermoelectric cooler and the second thermoelectric cooler to transfer heat comprises applying power to each based on a ratio of the temperature of the electronic component to the temperature of the second electronic component.

11. The method of claim 5, further comprising receiving an indication of a startup for the electronic component, and wherein causing the thermoelectric cooler to transfer heat is further in response to the indication of the startup.

12. A cooling system comprising:
a thermosiphon comprising a condenser, a first evaporator, a second evaporator, a hot working fluid conduit, and a cold working fluid conduit, wherein the first evaporator is thermally coupled with a first electronic component and comprises a first evaporator inlet and a first evaporator outlet, wherein the second evaporator is thermally coupled with a second electronic component and comprises a second evaporator inlet and a second evaporator outlet, wherein the condenser comprises a condenser inlet and a condenser outlet, wherein the condenser inlet is in fluid communication with the first evaporator outlet and the second evaporator outlet through the hot working fluid conduit, wherein the condenser outlet is in fluid communication with the first evaporator inlet and the second evaporator inlet through the cold working fluid conduit, wherein a working fluid of the thermosiphon is conveyed via convection;

a first thermoelectric cooler configured to transfer heat from the working fluid at or upstream of the first evaporator inlet to the working fluid at or downstream of the first evaporator outlet;

a second thermoelectric cooler configured to transfer heat from the working fluid at or upstream of the second evaporator inlet to the working fluid at or downstream of the second evaporator outlet;

a processor; and a non-transitory computer-readable medium storing instructions that, when executed by the processor, cause the processor to:
receive first component temperature data indicative of a temperature of the first electronic component;
receive second component temperature data indicative of a temperature of the second electronic component;
control supply of power to the first thermoelectric cooler to induce flow of the working fluid through the first evaporator based on the first component temperature data; and
control supply of power to the second thermoelectric cooler to induce flow of the working fluid through the second evaporator based on the second component temperature data.

13. The cooling system of claim 12, wherein the condenser comprises a coldplate.

14. The cooling system of claim 12, wherein:
the first thermoelectric cooler is configured to transfer heat from the working fluid at the first evaporator inlet to the working fluid at the first evaporator outlet; and
the second thermoelectric cooler is configured to transfer heat from the working fluid at the second evaporator inlet to the working fluid at the second evaporator outlet.

15. The cooling system of claim 12, wherein the instructions, when executed by the processor, further cause the processor to:
receive first evaporator temperature data indicative of a temperature difference between the working fluid at or downstream of the first evaporator outlet and the working fluid at or upstream of the first evaporator inlet;

control supply of power to the first thermoelectric cooler further based on the first evaporator temperature data;

receive second evaporator temperature data indicative of a temperature difference between the working fluid at or downstream of the second evaporator outlet and the working fluid at or upstream of the second evaporator inlet; and control supply of power to the second thermoelectric cooler further based on the second evaporator temperature data.

16. The cooling system of claim 15, wherein the instructions, when executed by the processor, further cause the processor to cease supply of power to at least one of the first thermoelectric cooler or the second thermoelectric cooler in response to determining, based on at least one of the first evaporator temperature data or the second evaporator temperature data, that the thermosiphon is operating in a steady state.

17. The cooling system of claim 12, wherein power supplied to the first thermoelectric cooler and power supplied to the second thermoelectric cooler is further based on a difference between the temperature of the first electronic component and the temperature of the second electronic component.

18. The cooling system of claim 17, wherein the power supplied to the first thermoelectric cooler and the power supplied to the second thermoelectric cooler is further based on a ratio between the temperature of the first electronic component and the temperature of the second electronic component.

* * * * *